(12) United States Patent
Chen

(10) Patent No.: US 7,423,566 B2
(45) Date of Patent: Sep. 9, 2008

(54) SIGMA-DELTA MODULATOR USING A PASSIVE FILTER

(75) Inventor: Feng Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 720 days.

(21) Appl. No.: 10/661,287

(22) Filed: Sep. 12, 2003

(65) Prior Publication Data

US 2005/0057383 A1    Mar. 17, 2005

(51) Int. Cl.
*H03M 3/00*    (2006.01)
(52) U.S. Cl. ........................................ 341/143
(58) Field of Classification Search ............ 341/143
See application file for complete search history.

(56) References Cited

U.S. PATENT DOCUMENTS

| | | | | |
|---|---|---|---|---|
| 4,860,012 | A * | 8/1989 | Rich et al. | 341/143 |
| 5,103,228 | A * | 4/1992 | Voorman et al. | 341/143 |
| 5,227,795 | A * | 7/1993 | Yamakido et al. | 341/166 |
| 6,064,871 | A * | 5/2000 | Leung | 455/323 |
| 6,069,722 | A | 5/2000 | Schlag | 398/183 |
| 6,404,367 | B1 * | 6/2002 | Van der Zwan et al. | 341/143 |

OTHER PUBLICATIONS

Benabes, P. et al.; Passive sigma-delta converter design, Instrumentation and Measurement Technology Conference, 2002. IMTC/2002. Proceedings of the 19th IEEE, vol. 1, Iss., 2002 pp. 469-474 vol. 1.*

Feng Chen et al.; A 0.25 mW 13 b passive ΣΔ modulator for a 10 MHz IF input; Solid-State Circuits Conferenc 1996. Digest of Technical Papers. 43rd ISSCC., 1996 IEEE International, Vol., Iss., Feb. 1996, pp. 58-59, 418.*

Chen et al., A 0.25-mW Low-Pass Passive Sigma-Delta Modulator with Built-In Mixer for a 10-MHz IF Input, IEEE Journal of Solid-State Circuits, vol. 32, No. 6, Jun. 1997 pp. 774-782.*

* cited by examiner

*Primary Examiner*—Howard Williams
(74) *Attorney, Agent, or Firm*—Wade James Brady, III; Frederick J. Telecky, Jr.

(57) ABSTRACT

A sigma-delta modulator includes a discrete time circuit that receives a digital feedback signal and an input signal, where the input signal includes information and one or more analog input currents. The discrete time circuit converts the digital feedback signal into an analog feedback signal during a first discrete time and sums the analog feedback signal and the one or more analog input currents during a second discrete time to yield one or more summed signals. A continuous time circuit includes passive elements, is coupled to the discrete time circuit, and operates to filter the one or more summed signals using a first-order filter and a second-order filter in order to generate one or more filtered signals. A quantizer is coupled to the continuous time circuit and generates the digital signal using the one or more filtered signals, where the digital signal comprising the information.

20 Claims, 1 Drawing Sheet

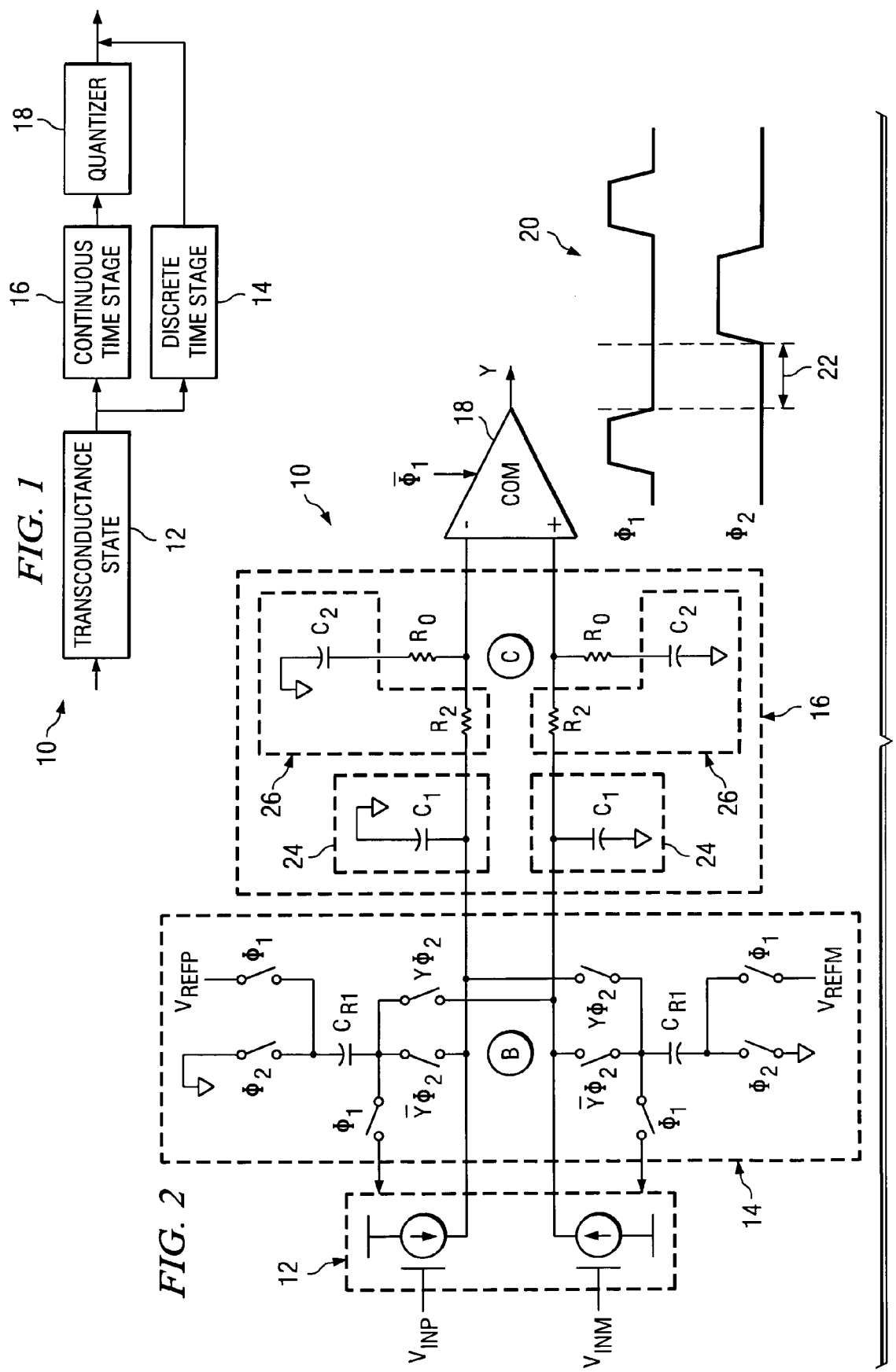

SIGMA-DELTA MODULATOR USING A PASSIVE FILTER

TECHNICAL FIELD OF THE INVENTION

This invention relates generally to the field of signal processing and more specifically to a sigma-delta modulator using a passive filter.

BACKGROUND OF THE INVENTION

Sigma-delta modulation typically involves using active filters to perform integrator functions. Active filters, however, may include active components such as transistors and operational amplifiers that may consume a significant amount of power. Additionally, depending on the active components of active filters may require the sigma-delta modulation to run at limited speeds.

SUMMARY OF THE INVENTION

In accordance with the present invention, disadvantages and problems associated with previous techniques for sigma-delta modulation may be reduced or eliminated.

According to one embodiment a sigma-delta modulator includes a discrete time circuit that receives a digital feedback signal and an input signal, where the input signal includes information and one or more analog input currents. The discrete time circuit converts the digital feedback signal into an analog feedback signal during a first discrete time and sums the analog feedback signal and the one or more analog input currents during a second discrete time to yield one or more summed signals. A continuous time circuit includes passive elements, is coupled to the discrete time circuit, and operates to filter the one or more summed signals using first-order filters in order to generate one or more filtered signals. A quantizer is coupled to the continuous time circuit and generates the digital signal using the one or more filtered signals, where the digital signal comprises the information.

Certain embodiments of the invention may provide one or more technical advantages. A technical advantage of one embodiment may be that a sigma-delta modulator does not require active components, which may allow the sigma-delta modulator to run at low power and low voltage. Another technical advantage of one embodiment may be that the sigma-delta modulator may be run at speeds unconstrained by components, which may allow the sigma-delta modulator to yield a higher resolution while maintaining low power consumption.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 1 is a block diagram of one embodiment of a sigma-delta modulator using a passive filter in accordance with the present invention; and FIG. 2 is a circuit diagram of one embodiment of the sigma-delta modulator of FIG. 1 that may be used in accordance with the present invention.

DETAILED DESCRIPTION OF THE DRAWINGS

Embodiments of the present invention and its advantages are best understood by referring to FIGS. 1 and 2 of the drawings, like numerals being used for like and corresponding parts of the various drawings.

FIG. 1 is a block diagram of one embodiment of a sigma-delta modulator 10 using a passive filter in accordance with the present invention. In general, sigma-delta modulator 10 performs the analog to digital conversion of a signal by sampling and quantizing an analog signal using a discrete time circuit and a continuous time circuit that each include passive elements. According to the illustrated embodiment, sigma-delta modulator 10 includes a transconductance stage 12, a discrete time stage 14, a continuous time stage 16, and a quantizer 16 coupled as shown in FIG. 1.

Transconductance stage 12 receives an input voltage signal and converts it to an input current signal. According to one embodiment, transconductance stage 12 comprises at least one transconductor that receives an analog signal comprising a positive voltage signal and a negative voltage signal. The positive voltage signal and the negative voltage signal may each be converted to a current signal with a current value proportional to the voltage amplitude of the corresponding signal. According to another embodiment, transconductance stage 12 may comprise a resistor that may be used if the input analog voltage signal requires a highly linear response. Any other configuration suitable for performing transconductance of an input voltage signal may be used without departing from the scope of the invention.

Discrete time stage 14 includes a discrete time circuit that performs discrete time operations. According to one embodiment, discrete time stage 14 comprises a plurality of switches and a feedback capacitor that perform operations at discrete times. For example, at a first discrete time the feedback capacitor is charged to a reference voltage, and at a second discrete time the feedback capacitor generates a current and reference voltage through summing node B in order for discrete time circuit 14 to sum a feedback signal and the input signal at summing node B.

To perform discrete time operations, discrete time stage 14 receives control signals and a digital feedback signal. As will be more particularly described with reference to FIG. 2, the control signals may comprise at least two discrete time signals $\phi_1$ and $\phi_2$. The discrete time signals $\phi_1$ and $\phi_2$ may activate the switches to perform the discrete time operations such as sampling the input signal, converting the digital feedback signal into an analog feedback signal, and summing the sampled input signal with the feedback signal. As another example, the discrete time circuit may generate a quantization error signal corresponding to the input analog signal by calculating the difference between the input analog signal and the analog feedback signal. Any other suitable function may be performed by the discrete time circuit of discrete time stage 14 without departing from the scope of the invention.

Continuous time stage 16 includes a continuous time circuit that may be used for filtering the quantization error signal. According to one embodiment, the continuous time circuit comprises a first filter and a second filter that operate to low-pass filter a signal according to a desired response. For example, the first filter may comprise a first capacitor that filters the quantized error signal according to a first low-pass response to yield a first filtered signal. The first capacitor may be selected such that the ratio between the capacitance of the first capacitor and the capacitance of the feedback capacitor are substantially greater than one. The second may comprise a resistor and a second capacitor that filter the first filtered signal according to a second low-pass response to yield an integrated signal.

According to one embodiment, although the filtering performed by the first filter and the second filter may be characterized as low-pass filtering, the filters may generate an integrated signal if the filters operate at a high frequency. Continuous time stage 16 may include passive components such as resistors and capacitors in order to perform the filtering functions at high frequencies, thus enabling the sigma-delta modulator 10 to perform at high frequencies while consuming low power. Any other suitable passive components may be used to perform the continuous circuit functions without departing from the scope of the invention.

Quantizer 18 digitizes the integrated signal to yield a digital signal corresponding to the sampled input analog signal. According to the illustrated embodiment, quantizer comprises a comparator that amplifies the integrated signal and compares the inputs to each other to generate a quantized signal. For example, the integrated signal may comprise two voltage signals that may be input at the comparator so that the voltage signals may be compared to each other and yield the digital output corresponding to the sampled analog signal. Quantizer 18 may comprise any other suitable one bit analog-to-digital converter without departing from the scope of the invention.

Modifications, additions, or omissions may be made to the system without departing from the scope of the invention. For example, transconductance stage 12 may be omitted such as if an analog input signal in current mode is applied to the discrete time stage 14. As another example, continuous time stage 16 may comprise filter circuits of any other suitable order without departing from the scope of the invention. Additionally, functions may be performed using any suitable logic comprising software, hardware, other logic, or any suitable combination of the preceding. "Each" as used in this document refers to each member of a set or each member of a subset of a set.

FIG. 2 is a circuit diagram of one embodiment of the sigma-delta modulator 10 of FIG. 1 that may be used in accordance with the present invention. In operation, sigma-delta modulator 10 receives an input analog signal and timing signals 20. According to one embodiment, timing signals 20 comprise nonoverlapping phase clock signals $\phi_1$ and $\phi_2$. A continuous time circuit filters signals received from a discrete time circuit to generate an integrated signal that is quantized by a comparator to yield a digital output. According to the illustrated embodiment, discrete time circuit and continuous time circuit comprise passive components that may enable sigma-delta modulator 10 to perform at high frequencies while consuming low power.

As was described with reference to FIG. 1, a transconductance stage 12 receives an input analog voltage $V_{in}$ and converts the input analog voltage $V_{in}$ into a current-mode analog signal. According to the illustrated embodiment, input analog voltage $V_{in}$ is converted to a couple of current sources, where each current source corresponds to a positive input voltage $V_{inp}$ and a negative input voltage $V_{inm}$. These current sources continuously deliver a current to summing node B. Transconductance stage 12 may improve the linearity of sigma-delta modulator 10; however, transconductance stage 12 may be omitted and replaced by a coupling resistor if a sufficiently large analog input signal in voltage-mode is applied to sigma-delta modulator 10. Transconductance stage 12 may also be omitted if a current-mode input signal is applied directly to sigma-delta modulator 10.

At summing node B, the current-mode analog signals are summed according to the discrete time operation of the switches and feedback signal. According to the illustrated embodiment, feedback capacitors $C_{R1}$ are precharged to reference voltages $V_{refp}$ and $V_{refm}$ according to a pulse of first discrete time signal $\phi_1$. Precharging feedback capacitors $C_{R1}$, which may result in an overall gain error, relaxes buffering speed requirements.

Feedback capacitors $C_{R1}$ discharge a discharge current to the appropriate side of the summing node B according to a pulse of second discrete time signal $\phi_2$. For example, on the positive side of the sigma-delta modulator 10, if digital signal Y is high, the discharge current is summed at the minus side of summing node B, and if digital signal Y is low, the discharge current is summed at the positive side of summing node B. Summing the discharge current in this fashion may result in the differential summing of the analog input signal and the digital signal Y, which is converted to an analog mode signal according to the discharge current.

The analog input signals (in current mode) are discretized and summed with the feedback signal at summing node B to yield quantization error signals according to a pulse of second discrete time signal $\phi_2$. The quantization error signals may be characterized as the difference between the analog input signal and a feedback signal, which in this case is the converted digital signal Y. Additional discrete times and additional switched circuits may be used without departing from the scope of the invention. Consequently, additional timing signals 20 may be used without departing from the scope of the invention.

According to the illustrated embodiment, the quantization error signals are filtered at continuous time stage by a first order low pass filter 14+24 and continuous time stage by another first order filter 26. First filter 14+24 and the second filter 26 low-pass filter the quantization error signals If sigma-delta modulator 10 processes signals at high frequencies, first filter 14+24 and second filter 26 may operate as an integrator that integrates the quantization error signal without the use of operational amplifiers that may require a specific bandwidth and frequency of operation and power consumption as compared to a passive circuit as that illustrated.

First filter 14+24 comprises a capacitor $C_1$ and a switched feedback capacitor $C_{R1}$ that filter the quantization error signal in a discrete time to yield a first filtered signal. The capacitors $C_1$ and $C_{R1}$ may be directly coupled to summing node B to low-pass filter the quantization error signal. According to one embodiment, first capacitor $C_1$ may be selected so that the ratio between first capacitor $C_1$ and feedback capacitor $C_{R1}$ satisfies Equation (1):

$$\frac{C_1}{C_{R1}} >>> 1 \tag{1}$$

so that the pole frequency $$\left( f_{pole1} = \frac{f_{clk} C_{R1}}{C_1} \right)$$

of the first order filter can be set to be sufficiently low, where $f_{clk}$ is the system clock rate and $f_{pole1}$ is the pole frequency.

The second first order filter 26 comprises a second capacitor $C_2$ and a second resistor $R_2$ that filter the first filtered signal in a continuous time to yield an integrated signal. According to the illustrated embodiment, second capacitor $C_2$ and a second resistor $R_2$ may be directly coupled to integration node C to filter the first filtered signal according to a low-pass response. Second capacitor $C_2$ and a second resistor $R_2$ may be selected according to a desired frequency response. According to the illustrated embodiment, second capacitor $C_2$ and a second resistor $R_2$ may be selected so that the frequency response substantially approximates a direct current (DC) frequency response with a pole close to zero frequency. For example, second capacitor $C_2$ and a second resistor $R_2$ may be selected according to Equation (2):

$$f_{pole2} = \frac{f_{clk} C_{R1}}{C_1} << f_{clk} \qquad (2)$$

A stabilizing resistor $R_0$ may be used to increase the stability of the overall modulator loop circuit. Any other suitable passive components may be used at continuous time circuit as well as at discrete time circuit and any additional or other filtering circuits may be used without departing from the scope of the invention.

Comparator 18 is engaged during the inverse of the first discrete time signal $\overline{\phi_1}$ to amplify the voltage of the signal present at integration node C. According to the illustrated embodiment, second discrete time signal $\phi_2$ may have a delay 22 to ensure that a digital signal Y is available before amplifying the signal received from integration node C. Making available a valid digital output Y at the comparator before the next pulse of second discrete time signal $\phi_2$, may allow for smoother DAC conversion. This embodiment may also reduce or eliminate high timing jitter requirements on the clock that may involved with implementing a feedback DAC.

According to the illustrated embodiment, the comparator receives a minus loop signal at the noninverting input and a positive loop signal at the inverting input. The comparator may compare the signals present at the inverting and noninverting inputs to generate digital output Y. It will be understood that the comparator may comprise any voltage comparator or any other device suitable for quantizing a received analog signal. Any other suitable one bit analog-to-digital (A/D) converter may be used at the comparator without departing from the scope of the invention.

Modifications, additions, or omissions may be made to the system without departing from the scope of the invention. For example, other suitable first order and second order filters may be used. Additionally, functions may be performed using any suitable logic comprising software, hardware, other logic, or any suitable combination of the preceding.

Certain embodiments of the invention may provide one or more technical advantages. A technical advantage of one embodiment may be that a sigma-delta modulator does not require active components, which may allow the sigma-delta modulator to run at low power and low voltage. Another technical advantage of one embodiment may be that the sigma-delta modulator may be run at speeds unconstrained by components, which may allow the sigma-delta modulator to yield a higher resolution while maintaining low power consumption.

Although an embodiment of the invention and its advantages are described in detail, a person skilled in the art could make various alterations, additions, and omissions without departing from the spirit and scope of the present invention as defined by the appended claims.

What is claimed is:

1. A sigma-delta modulator, comprising:
   digital feedback signal source for providing a digital feedback signal;
   a passive discrete time circuit for receiving the digital feedback signal and an input signal, the input signal comprising information and a pair of analog input currents; converting the digital feedback signal into an analog feedback signal during a first discrete time; and summing the analog feedback signal and a selected one of said pair of analog input currents during a second discrete time to yield a summed signal;
   a passive continuous time circuit comprising a plurality of passive resistive and capacitive elements, the continuous time circuit coupled to the discrete time circuit to filter the summed signal using a first first-order filter containing resistive and capacitive elements serially connected to a second first order filter containing resistive and capacitive elements to form a second first order filter to generate a filtered signal, the first-order filters comprising one or more first passive elements of the plurality of passive elements, and
   a quantizer coupled to the continuous time circuit to generate the digital signal using the filtered signal, the digital signal comprising the information, said digital signal determining the selected one of said pair of input signals.

2. The sigma delta modulator of claim 1, further comprising a transconductance circuit to: receive the input signals comprising the information and convert the analog input voltages into analog input currents.

3. The sigma-delta modulator of claim 1, wherein the discrete time circuit converts the digital feedback signal into an analog feedback signal using a reference voltage, the reference voltage supplied by a reference capacitor, the reference capacitor charged to the reference voltage during the first discrete time.

4. The sigma-delta modulator of claim 1, wherein:
   the one or more passive elements associated with the first first order filter comprises a first capacitor; and
   the one or more passive elements associated with the second first order filter comprises a second capacitor and a resistor.

5. The sigma-delta modulator of claim 1, wherein:
   the one or more passive elements associated with the second first order filter comprises a second capacitor and a resistor, the second capacitor associated with a second capacitance, the resistor associated with a resistance; and
   the second capacitance and the resistance selected according to a frequency response, the frequency response corresponding to a direct current frequency.

6. The sigma-delta modulator of claim 1, wherein the quantizer comprises a comparator to generate the digital signal using the filtered signal by:
   amplifying the filtered signal; and
   comparing the filtered signal to another filtered signal to quantize an error associated with the input signal and the digital signal.

7. The sigma-delta modulator of claim 1, wherein the output of the quantizer is coupled to the discrete time circuit in order to form a passive feedback loop, the passive feedback loop operable to convert the digital signal into an analog feedback signal.

8. A sigma-delta modulator, comprising:
   a discrete time circuit for receiving a digital feedback signal and an input signal, the input signal comprising information and a pair of analog input currents; converting the digital feedback signal into an analog feedback signal during a first discrete time; and summing the analog feedback signal and a selected one of said pair of analog input currents during a second discrete time to yield a summed signal;

a continuous time circuit comprising a plurality of passive elements, the continuous time circuit coupled to the discrete time circuit and operable to filter the summed signal using a first first-order filter serially connected to a second first order filter to form a second order filter in order to generate a filtered signal, the first-order filters comprising one or more first passive elements of the plurality of passive elements; and a quantizer coupled to the continuous time circuit and operable to generate the digital signal using the filtered signal, the digital signal comprising the information; wherein:

the discrete time circuit comprises a reference capacitor, the reference capacitor associated with a reference capacitance;

the passive elements associated with the first first order filter comprises a first capacitor, the first capacitor associated with a first capacitance; and the ratio between the first capacitance and the reference capacitance is substantially greater than one.

9. A method for converting an input signal into a digital signal, comprising the steps of:

providing a passive discrete time circuit;

at said passive discrete time circuit (a) receiving a digital feedback signal and a pair of input signals, the input signals comprising information and analog input currents; (b) converting the digital feedback signal into an analog feedback signal during a first discrete time; and (c) summing the analog feedback signal and a selected one of the analog input currents during a second discrete time to yield a summed signal;

providing a passive continuous time circuit;

at said passive continuous time circuit (a) filtering the summed signal at a continuous time circuit in order to generate a filtered signal, the continuous time circuit comprising a first passive first-order filter and a second passive first order filter, the first first-order filter comprising one or more first passive resistive and capacitive elements of the plurality of passive elements, the second first order filter comprising one or more second passive resistive and capacitive elements of the plurality of passive elements; and (b) generating the digital signal using the filtered signal, the digital signal comprising the information, said digital signal determining the selected one of said pair of input signals.

10. The method of claim 9, further comprising:

receiving at a transconductance circuit the input signal comprising the information, the input signal having said pair of analog input voltages; and converting the analog input voltages into the one or more analog input currents.

11. The method of claim 9, wherein converting the digital feedback signal into an analog feedback signal during the first discrete time further comprises using a reference voltage, the reference voltage supplied by a reference capacitor, the reference capacitor charged to the reference voltage during the first discrete time.

12. The method of claim 9, wherein:

the one or more first passive elements associated with the first first order filter comprises a first capacitor; and the one or more second passive elements associated with the second first order filter comprises a second capacitor and a resistor.

13. The method of claim 9, wherein:

the one or more second passive elements associated with the second first order filter comprises a second capacitor and a resistor, the second capacitor associated with a second capacitance, the resistor associated with a resistance; and the second capacitance and the resistance selected according to a frequency response, the frequency response corresponding to a direct current frequency.

14. The method of claim 9, wherein generating the digital signal using the one or more filtered signals further comprises:

amplifying the filtered signal; and comparing at a comparator the filtered signal to another filtered signal to quantize an error associated with the input signal and the digital signal.

15. The method of claim 9, wherein the output of the quantizer is coupled to the discrete time circuit to form a passive feedback loop, the passive feedback loop converting the digital signal into an analog feedback signal.

16. A method for converting an input signal into a digital signal, comprising the steps of:

providing a discrete time circuit;

at said discrete time circuit (a) receiving a digital feedback signal and an input signal at a discrete time circuit, the input signal comprising information and one or more analog input currents; (b) converting the digital feedback signal into an analog feedback signal during a first discrete time; and (c) summing the analog feedback signal and the one or more analog input currents during a second discrete time to yield one or more summed signals;

providing a continuous time circuit;

at said continuous time circuit (a) filtering the one or more summed signals at a continuous time circuit in order to generate one or more filtered signals, the continuous time circuit comprising a first first-order passive filter and a second first order passive filter, the first first-order filter comprising one or more first passive elements of the plurality of passive elements, the second first order passive filter comprising one or more second passive elements of the plurality of passive elements; and (b) generating the digital signal using the one or more filtered signals, the digital signal comprising the information;

wherein: the discrete time circuit comprises a reference capacitor;

the one or more first passive elements associated with the first first order filter comprises a first capacitor; and the ratio between the first capacitor and the reference capacitor is substantially greater than one.

17. A sigma-delta modulator, comprising:

means for receiving a digital feedback signal and a pair of analog input signals at a discrete time circuit, the input signal comprising information and analog input currents;

means for converting the digital feedback signal into an analog feedback signal during a first discrete time;

means for summing the analog feedback signal and a selected one of said pair of analog input currents during a second discrete time to yield a summed signal;

means for filtering the summed signals at a continuous time circuit in order to generate a filtered signal, the continuous time circuit comprising a first passive first-order filter and a passive second passive first order filter, each filter containing both resistive and capacitive elements; and means for generating the digital signal using the filtered signal, the digital signal comprising the information, said digital signal determining the selected one of said pair of input signals.

18. A sigma-delta modulator, comprising:

a discrete time circuit to: receive a digital feedback signal and an input signal, the input signal comprising information and one or more analog input currents; convert the digital feedback signal into an analog feedback signal during a first discrete time using a reference voltage, the reference voltage supplied by a reference capacitor, the reference capacitor charged to the reference voltage during the first discrete time; and sum the analog feedback signal and the one or more analog input currents during a second discrete time to yield one or more summed signals, the discrete time circuit further comprising a reference capacitor, the reference capacitor associated with a reference capacitance;

a passive continuous time circuit comprising a plurality of passive elements, the continuous time circuit coupled to the discrete time circuit and filtering the one or more summed signals using a first first-order filter and a second first order filter in order to generate one or more filtered signals, the first first-order filter comprising one or more first passive elements of the plurality of passive elements, the second first order filter comprising one or more second passive elements of the plurality of passive elements, the one or more first passive elements associated with the first first order filter comprising a first capacitor, the one or more second passive elements associated with the second first order filter comprising a second capacitor and a resistor, the ratio between the first capacitance and the reference capacitance is substantially greater than one;

a quantizer coupled to the continuous time circuit and operable to generate the digital signal using the one or more filtered signals, the digital signal comprising the information; and a transconductance circuit for receiving the input signal comprising the information, the input signal having one or more analog input voltages; and
converting the one or more analog input voltages into one or more analog input currents.

19. The sigma-delta modulator of claim 18, wherein:

the one or more second passive elements associated with the second first order filter comprises a second capacitor and a resistor, the second capacitor associated with a second capacitance, the resistor associated with a resistance; and the second capacitance and the resistance selected according to a frequency response, the frequency response corresponding to a direct current frequency.

20. The sigma-delta modulator of claim 18, wherein the quantizer comprises a comparator operable to generate the digital signal using the one or more filtered signals by:

amplifying the one or more filtered signals; and comparing the one or more filtered signals to each other to quantize an error associated with the input signal and the digital signal, wherein the output of the comparator is coupled to the discrete time circuit in order to form a passive feedback loop, the passive feedback loop operable to convert the digital signal into an analog feedback signal.

* * * * *